(12) United States Patent
Higashionji et al.

(10) Patent No.: US 7,701,115 B2
(45) Date of Patent: Apr. 20, 2010

(54) DRIVE UNIT

(75) Inventors: Masaru Higashionji, Osaka (JP);
Hideaki Mukae, Hyogo (JP); Yusuke Adachi, Osaka (JP); Eiichi Nagaoka, Hyogo (JP)

(73) Assignee: Panasonic Corporation, Kadoma (JP)

( * ) Notice: Subject to any disclaimer, the term of this patent is extended or adjusted under 35 U.S.C. 154(b) by 56 days.

(21) Appl. No.: 12/111,247

(22) Filed: Apr. 29, 2008

(65) Prior Publication Data
US 2008/0272672 A1 Nov. 6, 2008

(30) Foreign Application Priority Data
May 1, 2007 (JP) .............................. 2007-120959

(51) Int. Cl.
*H01L 41/09* (2006.01)
(52) U.S. Cl. ...................................... 310/315; 310/346
(58) Field of Classification Search ................. 310/315, 310/346
See application file for complete search history.

(56) References Cited

U.S. PATENT DOCUMENTS

| | | | |
|---|---|---|---|
| 5,365,139 A * | 11/1994 | Kasuga et al. ............ | 310/316.02 |
| 6,727,635 B2 * | 4/2004 | Okamoto et al. ......... | 310/316.01 |
| 6,979,936 B1 * | 12/2005 | Ganor et al. ................ | 310/328 |
| 7,408,288 B2 * | 8/2008 | Hara ...................... | 310/323.01 |
| 2008/0179996 A1 * | 7/2008 | Adachi ........................ | 310/334 |
| 2008/0278033 A1 * | 11/2008 | Adachi et al. ............... | 310/317 |
| 2008/0278035 A1 * | 11/2008 | Higashionji et al. ......... | 310/330 |

FOREIGN PATENT DOCUMENTS

JP    2004-304963    10/2004

* cited by examiner

*Primary Examiner*—Thomas M Dougherty
(74) *Attorney, Agent, or Firm*—Renner, Otto, Boisselle & Sklar, LLP

(57) ABSTRACT

A drive unit includes a control unit for controlling an ultrasonic actuator. The control unit performs switching between a normal operation mode in which the piezoelectric element unit vibrates at a frequency close to a resonance frequency of longitudinal vibration in the lengthwise direction of the piezoelectric element unit and a resonance frequency of bending vibration to let the ultrasonic actuator output a driving force and a heating mode in which the piezoelectric element unit vibrates at a frequency close to a resonance frequency of longitudinal vibration in the thickness direction of the piezoelectric element unit to heat the piezoelectric element.

5 Claims, 11 Drawing Sheets

DRIVE UNIT

BACKGROUND OF THE INVENTION

1. Field of the Invention

The present invention relates to a drive unit including a vibration actuator using a piezoelectric element.

2. Description of Related Art

A drive unit including a vibration actuator using a piezoelectric element is known (cf., Japanese Unexamined Patent Publication No. 2004-304963) and used in ultrasonic motors and devices which make small step-by-step displacement.

The vibration actuator is placed between a stationary body and a movable body arranged movably relative to the stationary body. Specifically, the vibration actuator is fixed to one of the stationary and movable bodies with part thereof (e.g., a driver element) outputting a driving force in touch with the other one of the stationary and movable bodies (hereinafter may be referred to as a touched body). When the drive unit applies an electric field to the piezoelectric element of the vibration actuator in this state, the piezoelectric element is displaced due to its piezoelectric characteristic and the vibration actuator makes vibration (e.g., longitudinal vibration and bending vibration). As a result, the movable body is moved in a predetermined direction by friction caused between the vibration actuator and the touched body.

SUMMARY OF THE INVENTION

According to the structure in which the driving force from the vibration actuator is transmitted to the touched body through the friction, the friction is reduced if a monolayer of water is formed on a contact surface between the vibration actuator and the touched body. As a result, the displacement of the vibration actuator is less likely to be transmitted to the touched body. In a worst case, the vibration actuator may slip and the movable body does not move.

An object of the present invention is to provide a drive unit which does not malfunction even in an environment where condensation is likely to occur.

The drive unit of the present invention is configured to drive the vibration actuator at a frequency different from a frequency during normal operation and at which the piezoelectric element is heated such that the condensation is removed.

To be more specific, the present invention is directed to a drive unit including a vibration actuator using a piezoelectric element. The drive unit further includes a control section for controlling the vibration actuator switchably between a normal operation mode in which the piezoelectric element vibrates at a predetermined frequency to let the vibration actuator output a driving force, and a heating mode in which the piezoelectric element vibrates at a frequency different from the frequency in the normal operation mode to heat the piezoelectric element.

According to the present invention, in the heating mode, the control section allows the piezoelectric element to vibrate at a frequency different from the frequency in the normal operation mode such that the piezoelectric element is heated. Therefore, condensation that may occur on the ultrasonic actuator is removed by heat generated by the piezoelectric element.

BRIEF DESCRIPTION OF THE DRAWINGS

FIG. 13A shows the stage not driven yet, FIG. 13B shows the stage driven by one of driver elements as the actuator body stretches in the lengthwise direction and FIG. 13C shows the stage driven by the other driver element as the actuator body contracts in the lengthwise direction.

DETAILED DESCRIPTION OF THE INVENTION

Hereinafter, embodiments of the present invention will be described with reference to the drawings.

Embodiment 1

Figure 1:
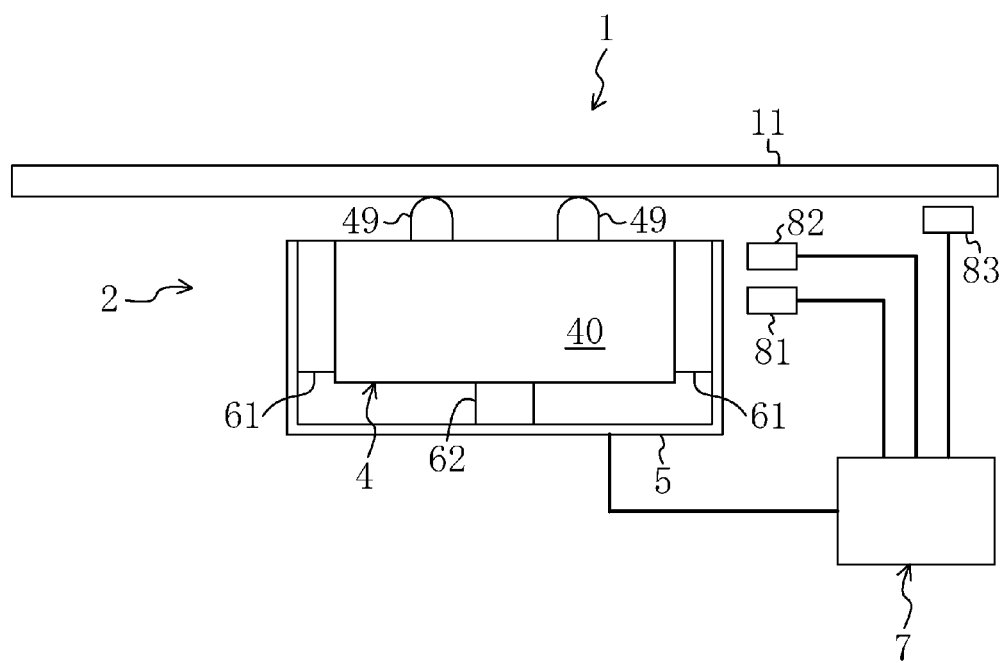
FIG. 1 is a schematic front view illustrating the schematic structure of a drive unit according to Embodiment 1 of the present invention.
Figure 2:
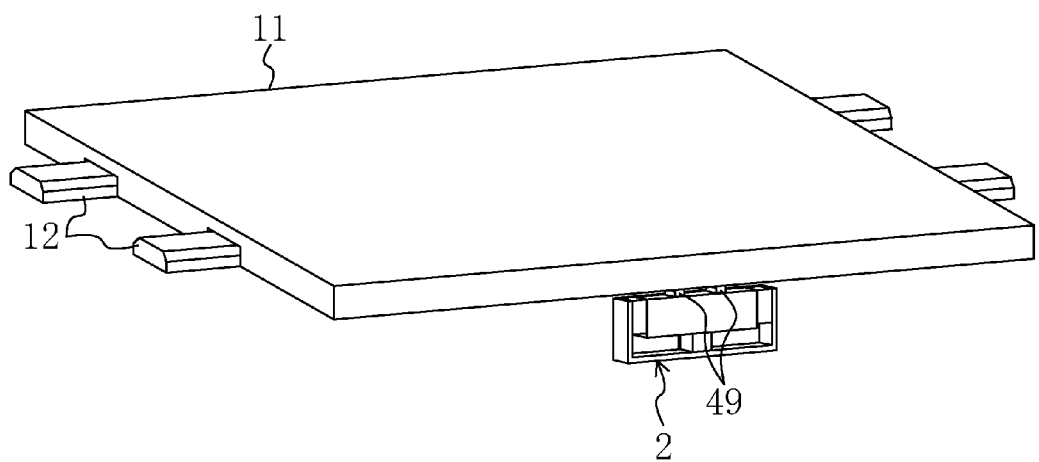
FIG. 2 is a perspective view of the drive unit.

A drive unit 1 according to Embodiment 1 of the invention includes, as shown in FIGS. 1 and 2, a stage 11, an ultrasonic actuator 2, a control unit 7 for controlling and driving the ultrasonic actuator 2, a temperature sensor 81 for detecting the temperature of the ultrasonic actuator 2, a condensation sensor 82 for detecting whether or not condensation has occurred on the ultrasonic actuator 2 and a position detection sensor 83 for detecting the present position of the stage 11.

The stage 11 is slidably attached to rails 12 fixed in parallel with each other to a base (not shown) as a stationary body. That is, the stage 11 is movable in the extending direction of the rails 12 (the extending direction of the rails 12 is the moving direction of the stage 11). The stage 11 is a plate-like member and substantially square-shaped when viewed in plan. The ultrasonic actuator 2 is arranged such that driver elements 49 described later come into contact with the rear surface of the stage 11 (the surface on which the rails 12 are provided).

Figure 3:
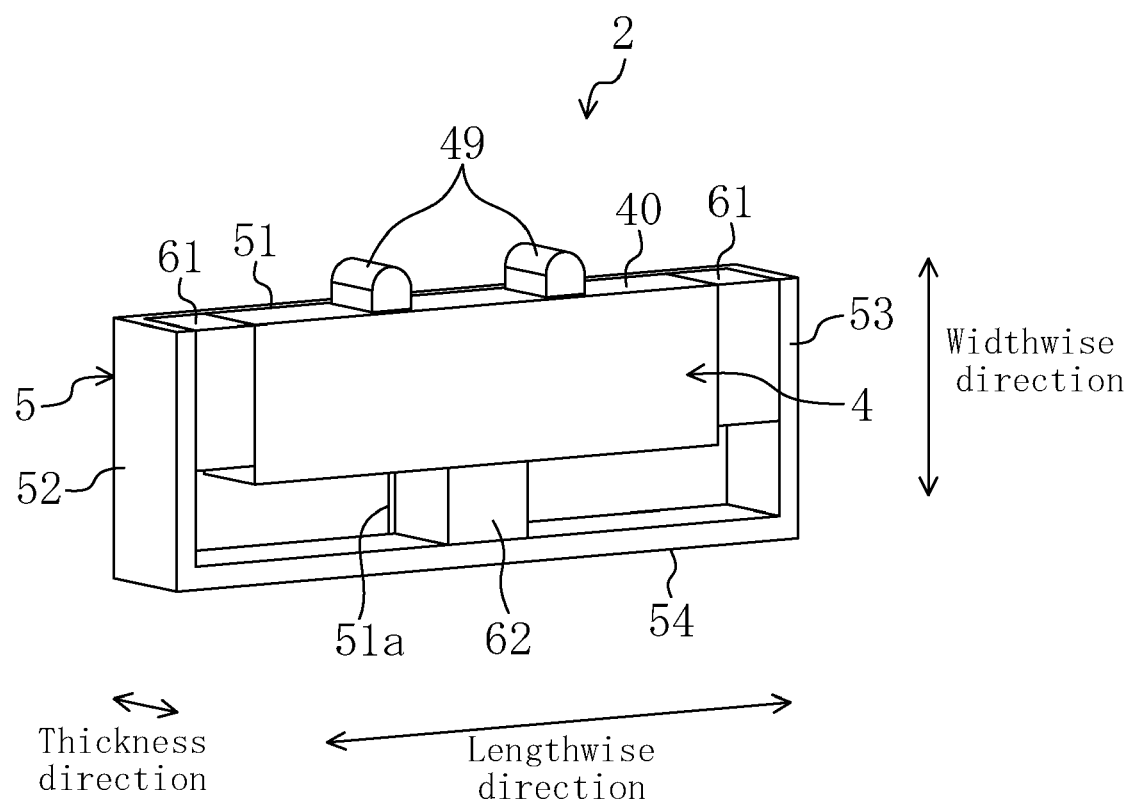
FIG. 3 is a perspective view of an ultrasonic actuator.

The ultrasonic actuator 2 includes, as shown in FIG. 3, an actuator body 4 which generates vibration, driver elements 49 for transmitting the driving force of the actuator body 4 to the stage 11, a case 5 for containing the actuator body 4, support rubbers 61 interposed between the actuator body 4 and the case 5 to elastically support the actuator body 4, and a bias rubber 62 for biasing the actuator body 4 to the stage 11. The ultrasonic actuator 2 functions as a vibration actuator.

The actuator body 4 comprises a piezoelectric element unit 40.

The piezoelectric element unit 40 is substantially in the form of a rectangular parallelepiped and has a pair of substantially rectangular principle surfaces facing each other, a pair of long side surfaces facing each other and extending in the lengthwise direction of the principle surfaces to be orthogonal to the principle surfaces and a pair of short side surfaces facing each other and extending in the widthwise direction of the principle surfaces to be orthogonal to both of the principle surfaces and the long side surfaces.

Figure 4:
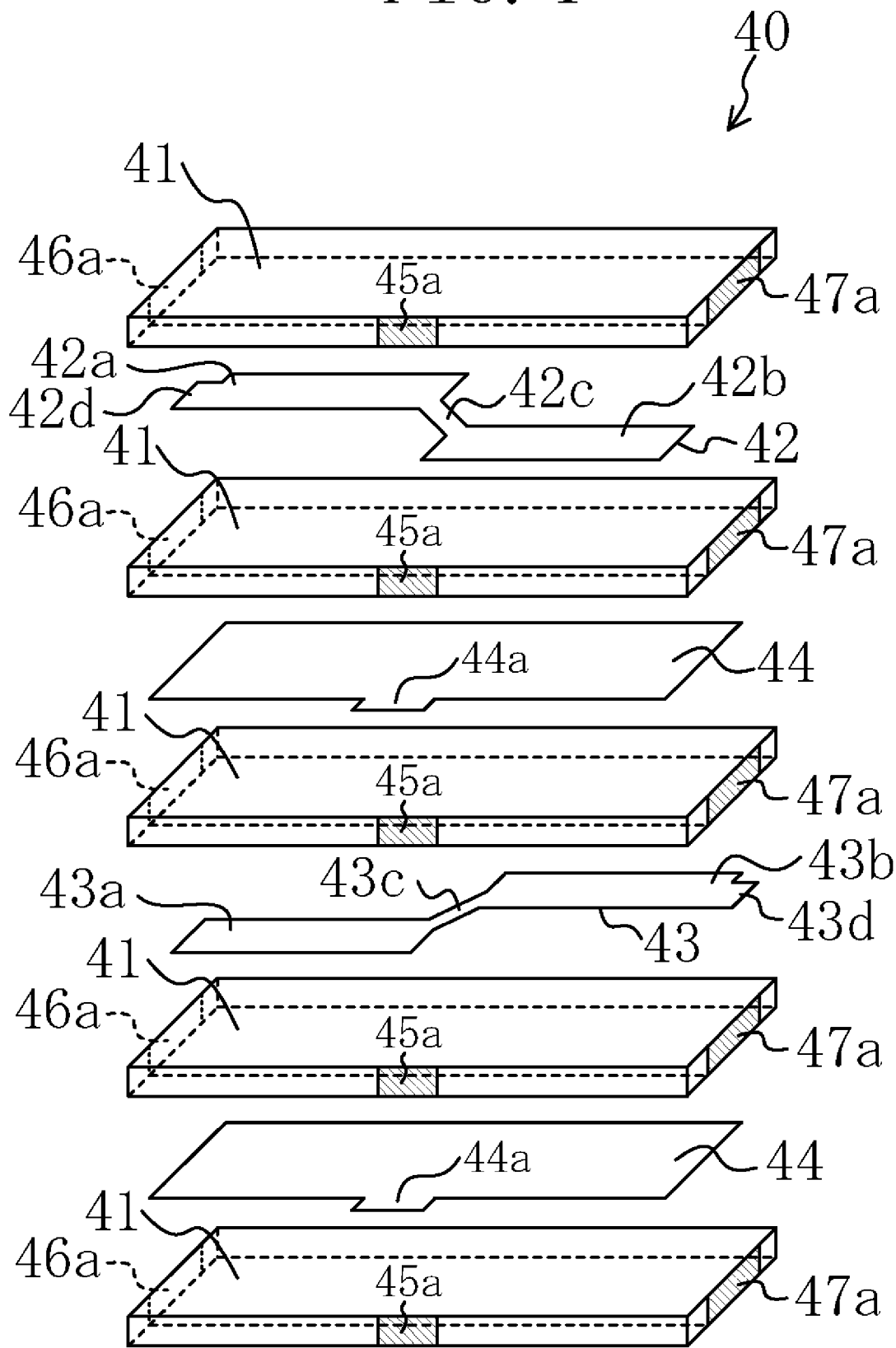
FIG. 4 is an exploded perspective view of a piezoelectric element unit.

As shown in FIG. 4, the piezoelectric element unit 40 is provided by alternately stacking five piezoelectric layers (piezoelectric elements) 41 and four internal electrode layers 42, 44, 43 and 44. Specifically, the internal electrode layers 42, 44, 43 and 44 are a first feeding electrode layer 42, a common electrode layer 44, a second feeding electrode layer 43 and a common electrode layer 44 stacked in this order alternately with the piezoelectric layers 41. The first feeding electrode layer 42, the second feeding electrode layer 43 and the common electrode layers 44 are printed on the principle surfaces of the piezoelectric layers 41, respectively.

Each of the piezoelectric layers 41 is an insulating layer made of ceramic such as lead zirconate titanate. Just like the piezoelectric element unit 40, the piezoelectric layer 41 is substantially in the form of a rectangular parallelepiped and has a pair of principle surfaces, a pair of long side surfaces and a pair of short side surfaces. Each of the piezoelectric layers 41 is provided with an external electrode 45a formed in the middle of one of the long side surfaces in the lengthwise direction, an external electrode 46a formed in the middle of one of the short side surfaces in the widthwise direction and an external electrode 47a formed in the middle of the other short side surface in the widthwise direction.

Each of the common electrode layers 44 is substantially rectangular and covers almost all the principle surface of the piezoelectric layer 41. The common electrode layer 44 has a lead electrode 44a extending from the middle of one of the long sides of the common electrode layer 44 in the lengthwise direction to the external electrode 45a of the piezoelectric layer 41.

Figure 5:
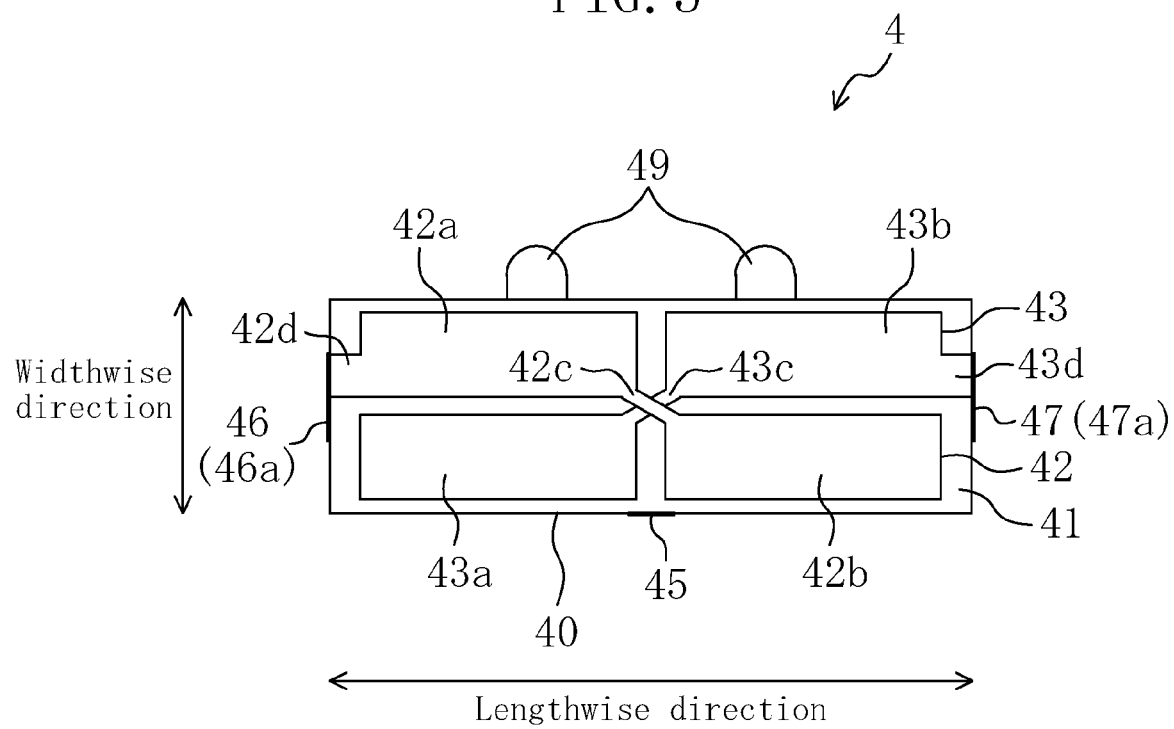
FIG. 5 is a schematic front view illustrating the schematic structure of an actuator body.

Suppose that the principle surface of the piezoelectric layer 41 is divided into quadrants, i.e., two areas in the lengthwise direction and two areas in the widthwise direction. The first feeding electrode layer 42 includes a pair of first electrodes 42a and 42b respectively formed on one of the pairs of diagonally aligned areas of the principle surface of the corresponding piezoelectric layer 41. A conductive electrode 42c connects the first electrodes 42a and 42b to bring them into conduction as shown in FIG. 5. The first electrodes 42a and 42b are each a substantially rectangular electrode that overlaps the common electrode layer 44 when viewed in the stacking direction. That is, the first electrode 42a (42b) is opposed to the common electrode layer 44 with the piezoelectric layer 41 interposed therebetween. One of the first electrodes 42a and 42b, i.e., the first electrode 42a, is provided with a lead electrode 42d extending to the external electrode 46a of the piezoelectric layer 41.

The second feeding electrode layer 43 includes a pair of second electrodes 43a and 43b respectively formed on the other pair of diagonally aligned areas of the piezoelectric surface of the corresponding piezoelectric layer 41. A conductive electrode 43c connects the second electrodes 43a and 43b to bring them into conduction. As viewed in the stacking direction represented schematically in FIG. 5, the second electrode 43a is provided to be adjacent to the first electrode 42a in the widthwise direction and adjacent to the first electrode 42b in the lengthwise direction. Similarly, the second electrode 43b is provided to be adjacent to the first electrode 42a in the lengthwise direction and adjacent to the first electrode 42b in the widthwise direction. The second electrodes 43a and 43b are each a substantially rectangular electrode that overlaps the common electrode layer 44 when viewed in the stacking direction. That is, the second electrode 43a (43b) is opposed to the common electrode layer 44 with the piezoelectric layer 41 interposed therebetween. One of the second electrodes 43a and 43b, i.e., the second electrode 43b, is provided with a lead electrode 43d extending to the external electrode 47a of the piezoelectric layer 41.

In the piezoelectric element unit 40 provided by alternately stacking the piezoelectric layers 41 and the internal electrode layers 42, 44, 43 and 44, the external electrodes 45a of the piezoelectric layers 41 are aligned in the stacking direction in the middle of one of the long side surfaces of the piezoelectric element unit 40 in the lengthwise direction to function as a single external electrode 45. The lead electrodes 44a of the common electrode layers 44 are electrically connected to the external electrode 45. Likewise, the external electrodes 46a of the piezoelectric layers 41 are aligned in the stacking direction in the middle of one of the short side surfaces of the piezoelectric element unit 40 in the widthwise direction to function as a single external electrode 46. The lead electrode 42d of the first feeding electrode layer 42 is electrically connected to the external electrode 46. Further, the external electrodes 47a of the piezoelectric layers 41 are aligned in the stacking direction in the middle of the other short side surface of the piezoelectric element unit 40 in the widthwise direction to function as a single external electrode 47. The lead electrode 43d of the second feeding electrode layer 43 is electrically connected to the external electrode 47.

On the other long side surface of the piezoelectric element unit 40, i.e., the long side surface where the external electrodes 45a are not formed, the driver elements 49 are arranged at an interval from each other in the lengthwise direction. The driver elements 49 are arranged at positions inside from the ends of the long side surface in the lengthwise direction by 30 to 35% of the total length of the long side surface. The positions are the antinodes of the second mode of bending vibration of the piezoelectric element unit 40 described later, i.e., positions at which the maximum vibration occurs. The driver elements 49 are preferably columnar elements, at least part of which in contact with the stage 11 has a circular section (specifically, a combination of a columnar element having a semicircle section and a columnar element having a rectangular section), and made of hard material such as ceramic. The driver elements 49 are arranged such that the lengthwise direction of the driver elements 49 is parallel to the thickness direction of the piezoelectric element unit 40 and the center of the driver elements 49 in the lengthwise direction is aligned with the center of the piezoelectric element unit 40 in the thickness direction.

With the external electrode 45 connected to electrical ground, an AC voltage of a predetermined frequency is applied to the external electrode 46, while an AC voltage having a phase shifted by 90° relative to that of the former AC voltage is applied to the external electrode 47. Accordingly, the AC voltage is applied to the pair of first electrodes 42a and 42b arranged along the diagonal line of the principle surface of the piezoelectric layer 41 and the AC voltage having a phase shifted by 90° from that of the former AC voltage is applied to the pair of second electrodes 43a and 43b arranged along the other diagonal line of the principle surface of the piezoelectric layer 41. This induces longitudinal vibration in the lengthwise direction (so-called stretching vibration) and bending vibration in the widthwise direction (so-called transverse vibration) of the piezoelectric element unit 40, i.e., the actuator body 4.

Resonance frequencies of the longitudinal vibration and the bending vibration are determined by the material and the shape of the actuator body 4, i.e., those of the piezoelectric element unit 40. The resonance frequencies are also varied depending on the force supporting the actuator body 4 and positions at which the actuator body 4 is supported. With these facts in mind, the resonance frequencies are adjusted so as to be substantially equal and AC voltages having a frequency close to the adjusted resonance frequency are applied to the external electrodes 46 and 47, respectively, while the phases of the AC voltages are shifted from each other by 90°. For example, if the shape of the piezoelectric element unit 40 is designed such that the first mode of longitudinal vibration (see FIG. 6) and the second mode of bending vibration (see FIG. 7) have the same resonance frequency and the AC voltages having a frequency close to the resonance frequency are applied with their phases shifted from each other by 90° as described above, the first mode of longitudinal vibration and the second mode of bending vibration occur in harmony in the piezoelectric element unit 40. Thus, the shape of the piezoelectric element unit 40 is varied in the order shown in FIGS. 8A to 8D.

As a result, the driver elements 49 of the piezoelectric element unit 40 make a substantially elliptical motion, i.e., circular motion, on a plane parallel to the principle surface of the piezoelectric element unit 40, i.e., a plane including the lengthwise direction and the widthwise direction (a plane parallel to the page surface in FIG. 8).

The case 5 is made of a resin and substantially in the form of a rectangular parallelepiped box corresponding to the shape of the piezoelectric element unit 40. The case 5 has a substantially rectangular main wall 51 parallel to the principle surface of the piezoelectric element unit 40, a first short side wall 52 provided on one short side of the main wall 51 at one end of the main wall 51 in the lengthwise direction (the left short side in FIG. 3), a second short side wall 53 provided on the other short side of the main wall 51 at the other end of the main wall 51 in the lengthwise direction (the right short side in FIG. 3), and a long side wall 54 provided on one long side of the main wall 51 at one end of the main wall 51 in the widthwise direction (the lower long side in FIG. 3). Specifically, the case 5 does not have a wall opposite the main wall 51 and a wall on the other long side of the main wall 51 at the other end of the main wall 51 in the widthwise direction (the upper long side of FIG. 3), i.e., a wall corresponding to the long side surface of the piezoelectric element unit 40 on which the driver elements 49 are formed. The case 5 is opened at a plane perpendicular to the stacking direction of the piezoelectric element unit 40 (normal direction of the main wall 51) and a plane at the other end of the main wall in the widthwise direction.

The actuator body 4 is contained in the thus-configured case 5. The actuator body 4 is placed in the case 5 such that one of the principle surfaces of the piezoelectric element unit 40 faces the main wall 51 and one of the long side surfaces of the piezoelectric element unit 40 (the long side surface on which the external electrode 45 is formed) faces the long side wall 54. The driver elements 49 protrude from the case 5 toward the other end in the widthwise direction. One of the support rubbers 61 is interposed between one of the short side surfaces of the piezoelectric element unit 40 and the first short side wall 52 of the case 5 and the other support rubber 61 is interposed between the other short side surface of the piezoelectric element unit 40 and the second short side wall 53 of the case 5. The short side surfaces of the piezoelectric element unit 40 are antinodes of the longitudinal vibration. Since the support rubbers 61 are elastic bodies, they can support the piezoelectric element unit 40 without hindering the longitudinal vibration of the piezoelectric element unit 40. The support rubbers 61 are in contact with not only the actuator body 4 and the first and second short side walls 52 and 53 but also the inner surface of the main wall 51. The bias rubber 62 is provided between one of the long side surfaces of the piezoelectric element unit 40 and the long side wall 54 of the case 5. The bias rubber 62 is in contact with not only the actuator body 4 and the long side wall 54 but also the inner surface of the main wall 51.

Electrodes 51a are formed on parts of the inner surface of the main wall 51 in contact with the support rubbers 61 and the bias rubber 62 (only one electrode in contact with the bias rubber 62 is shown in the figure). These electrodes are in conduction with terminal electrodes (not shown) formed on the outer surface of the main wall 51, respectively.

Each of the support rubbers 61 is substantially in the form of a rectangular parallelepiped and made of electrically conductive rubber prepared by mixing metal particles in silicone rubber. The support rubbers 61 elastically support the actuator body 4 and bias the actuator body 4 in the lengthwise direction of the actuator body 4. At the same time, the support rubbers 61 bring the external electrodes 46 and 47 of the piezoelectric element unit 40 into electrical conduction with the electrodes formed on the parts of the inner surface of the main wall 51 on the short sides thereof in electrical conduction with the terminal electrodes.

Just like the support rubbers 61, the bias rubber 62 is substantially in the form of a rectangular parallelepiped and made of electrically conductive rubber prepared by mixing metal particles in silicone rubber. The bias rubber 62 is adapted to bias the actuator body 4 in the widthwise direction of the actuator body 4 (the biasing direction is the widthwise direction). At the same time, the bias rubber 62 brings the external electrode 45 of the piezoelectric element unit 40 and the electrode 51a of the main wall 51 into electrical conduction.

With this configuration, feeding to the piezoelectric element unit 40 is achieved by feeding to the terminal electrodes formed on the outer surface of the case 5.

In the thus-configured ultrasonic actuator 2, the driver elements 49 are brought into contact with the bottom surface of the stage 11 and the case 5 is fixed to the base (not shown). To be more specific, the ultrasonic actuator 2 is arranged such that the widthwise direction of the piezoelectric element unit 40 is orthogonal to the bottom surface of the stage 11 and the lengthwise direction of the piezoelectric element unit 40 is parallel to the bottom surface of the stage 11 and the rails 12. In other words, the ultrasonic actuator 2 is arranged such that the direction of the bending vibration of the piezoelectric element unit 40 is orthogonal to the bottom surface of the stage 11 and the direction of the longitudinal vibration of the piezoelectric element unit 40 is parallel to the rails 12.

At the same time, the bias rubber 62 is compressed and deformed and the driver elements 49 are biased toward the stage 11 by the elastic force of the bias rubber 62. The biasing force of the ultrasonic actuator 2 on the stage 11 is determined by the elastic force of the bias rubber 62.

Referring to FIG. 1, the aforementioned temperature sensor 81 is attached to part of the base near the ultrasonic actuator 2 to measure the temperature of the ultrasonic actuator 2 (specifically, the temperature in the vicinity of the ultrasonic actuator 2). The temperature sensor 81 functions as a temperature detector.

The condensation sensor 82 is also attached to part of the base near the ultrasonic actuator 2 just like the temperature sensor 81 and detects whether or not the condensation has occurred on the ultrasonic actuator 2 (specifically, in the vicinity of the ultrasonic actuator 2). The condensation sensor 82 functions as a condensation detector.

The position detection sensor 83 detects the present position of the stage 11.

Figure 9:
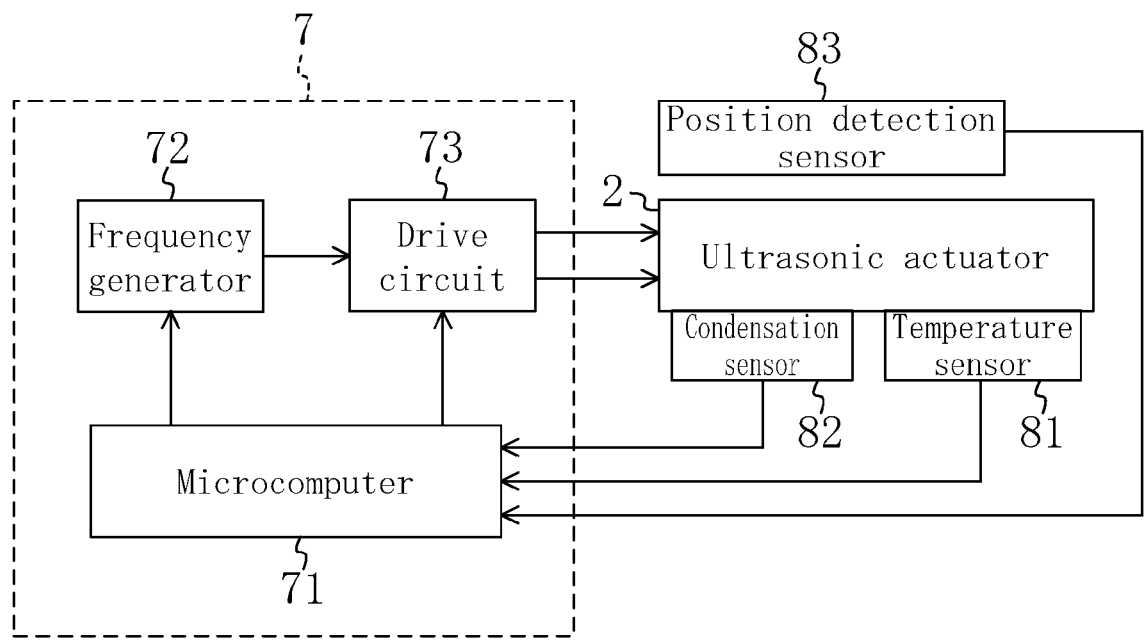
FIG. 9 is a block diagram illustrating the structure of a control unit.

The control unit 7 includes a microcomputer 71, a frequency generator 72 and a drive circuit 73 as shown in FIG. 9.

The microcomputer 71 receives an externally applied operation command and detection signals from the temperature sensor 81, the condensation sensor 82 and the position detection sensor 83 and outputs a control signal to the frequency generator 72 and the drive circuit 73. Specifically, the microcomputer 71 receives the externally applied operation command and the detection signals from the temperature sensor 81, the condensation sensor 82 and the position detection sensor 83. Based thereon, the microcomputer 71 determines the frequency, voltage value and a difference between phases of two AC voltages to be applied to the ultrasonic actuator 2. Then, the microcomputer 71 outputs a control signal corresponding to the determined frequency to the frequency generator 72 and a control signal corresponding to the determined voltage value and the phase difference to the drive circuit 73. The determination of the frequency, the voltage value and the phase difference of the two AC voltages by the microcomputer 71 will be described later.

The frequency generator 72 receives the control signal from the microcomputer 71 and produces an electrical signal having the frequency determined by the microcomputer 71, which is output to the drive circuit 73.

The drive circuit 73 receives the control signal from the microcomputer 71, amplifies the electrical signal input from the frequency generator 72 up to the voltage value determined by the microcomputer 71 and outputs two AC voltages having the phase difference determined by the microcomputer 71 to the ultrasonic actuator 2.

The control by the control unit 7 is now explained in more detail.

The control unit 7 (specifically, the microcomputer 71) drives and controls the ultrasonic actuator 2 by switching between a normal operation mode in which the ultrasonic actuator 2 is normally operated to move the stage 11 (normal operation mode) and a heating mode in which the piezoelectric element unit 40 is heated to remove the condensation on the ultrasonic actuator 2 (heating mode). To be more specific, the control unit 7 receives the detection signal from the condensation sensor 82 to judge whether or not the condensation has occurred on the ultrasonic actuator 2. If a judgment that the condensation has not occurred is made, the control unit 7 enters the normal operation mode. On the other hand, if it is judged that the condensation has occurred, the control unit 7 enters the heating mode.

In the normal operation mode, the longitudinal and bending vibrations occur in harmony in the piezoelectric element unit 40 as described above such that the driver elements 49 make the circular motion as shown in FIGS. 8A to 8D and the stage 11 is moved. Specifically, the microcomputer 71 determines the frequency, the voltage value and the difference between phases of two AC voltages to be applied to the ultrasonic actuator 2 based on the present position of the stage 11 calculated from the detection result of the position detection sensor 83 and the operation command. For example, in the normal operation mode, the microcomputer 71 sets the frequency of the AC voltages to be slightly higher than the common resonance frequency of the longitudinal vibration in the lengthwise direction of the piezoelectric element unit 40 and the bending vibration and sets the phase difference between the two AC voltages to 90° or −90° depending on the moving direction of the stage 11. Then, the microcomputer 71 determines the voltage value of the AC voltages based on the distance to the target position of the stage 11 obtained from the present position of the stage 11 and the operation command. Not only the voltage value, the frequency and the phase difference may be changed based on the distance to the target position of the stage 11.

The reason why the applied frequency is slightly higher than the common resonance frequency of the longitudinal vibration in the lengthwise direction of the piezoelectric element unit 40 and the bending vibration is applied is as follows. If the piezoelectric element unit 40 vibrates at the common resonance frequency, the amplitude of the vibration increases. At the same time, the impedance of the piezoelectric element unit 40 is extremely reduced and excessive current flows. This may result in abnormal heat generation and thermal damage. Therefore, the frequency slightly shifted from the resonance frequency is used in the normal operation mode.

Figure 10:
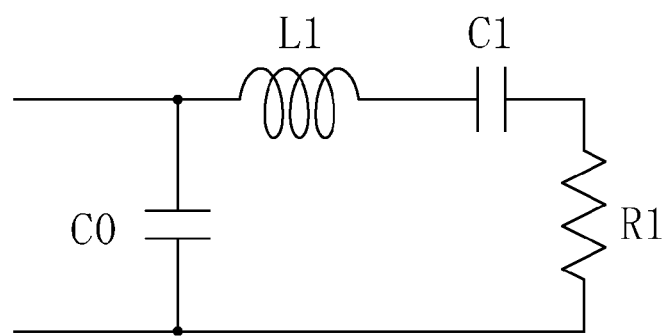
FIG. 10 is an equivalent circuit diagram of a piezoelectric element.

The piezoelectric element unit 40 during the resonance shows an electrical equivalent circuit as shown in FIG. 10, i.e., equivalent inductance L1, equivalent capacity C1 and resonant resistance R1 are connected in parallel to normal capacitance C0 of the piezoelectric element unit 40. The resonance is caused by the equivalent inductance L1 and the equivalent capacity C1, while only the resonance resistance R1 exists as a resistance load. In general, C0 is several 10 nF and the R1 value during the resonance is about several Ω. Therefore, when a dielectric body is driven at several tens kHz to several hundreds kHz, excessive current flows during the resonance.

Figure 11:
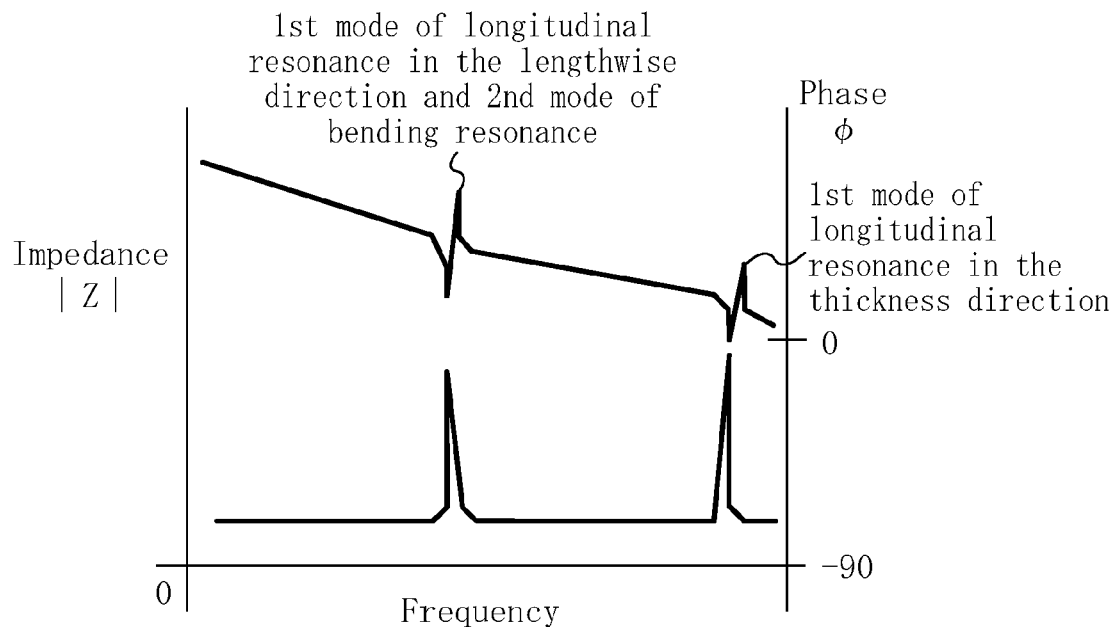
FIG. 11 is a graph illustrating relationship between driving frequency and impedance of the actuator body.

For example, if the piezoelectric element unit 40 is designed such that the first mode of longitudinal vibration in the lengthwise direction of the piezoelectric element unit 40 and the second mode of bending vibration have the same resonance frequency, the impedance is extremely reduced at the common resonance frequency of the first mode of longitudinal vibration in the lengthwise direction and the second mode of bending vibration as shown in FIG. 11. At the same time, the impedance extremely increases at the frequency slightly higher than the common resonance frequency (anti-resonance frequency). The abrupt increase in impedance is also observed at the resonance frequency of the other modes of vibration. For example, the impedance abruptly increases at the resonance frequency of the first mode of longitudinal vibration in the thickness direction (stacking direction) of the piezoelectric element unit 40. The variation in impedance at the resonance frequency of the other modes of vibration is not shown.

Figure 12:
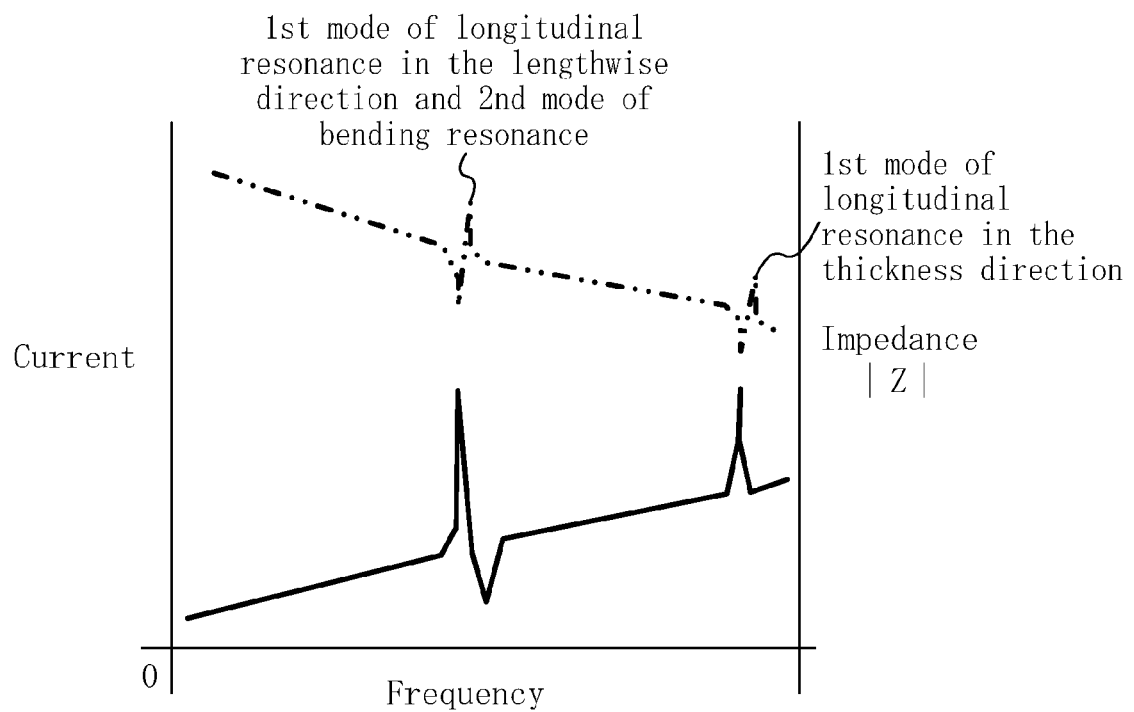
FIG. 12 is a graph illustrating relationship between driving frequency of the actuator body and current.

As a result, current flowing in the piezoelectric element unit 40 abruptly increases at the common resonance frequency of the first mode of longitudinal vibration in the lengthwise direction of the piezoelectric element unit 40 and the second mode of bending vibration as shown in FIG. 12. The current also increases abruptly at the resonance frequency of the longitudinal vibration in the thickness direction of the piezoelectric element unit 40.

If the ultrasonic actuator 2 is actuated at an AC voltage having a frequency slightly higher than the common resonance frequency of the longitudinal vibration in the lengthwise direction of the piezoelectric element unit 40 and the bending vibration, the longitudinal vibration in the lengthwise direction of the piezoelectric element unit 40 and the bending vibration occurs in harmony, the piezoelectric element unit 40 is less likely to generate heat and the power consumption is reduced.

Next, how the ultrasonic actuator 2 controlled in the normal operation mode drives the stage 11 will be explained.

As described above, when the actuator body 4 causes composite vibration of the longitudinal and bending vibrations, the driver elements 49 make a substantially elliptical motion on the plane including the lengthwise and widthwise directions of the piezoelectric element unit 40. The driver elements 49 periodically come in and out of contact with the stage 11 to move the stage 11 in the lengthwise direction of the piezoelectric element unit 40 by friction. Depending on the degree of the circular motion, the driver elements 49 do not come out of contact with the stage 11 but repeatedly increase and decrease the friction against the stage 11.

Figure 13A:
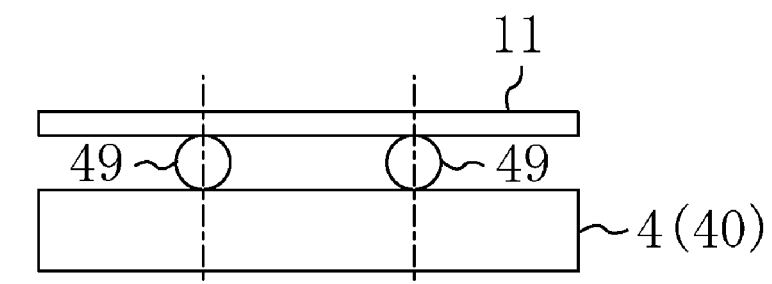
FIGS. 13A to 13C are conceptual diagrams illustrating how a stage is driven by the ultrasonic actuator.
Figure 13B:
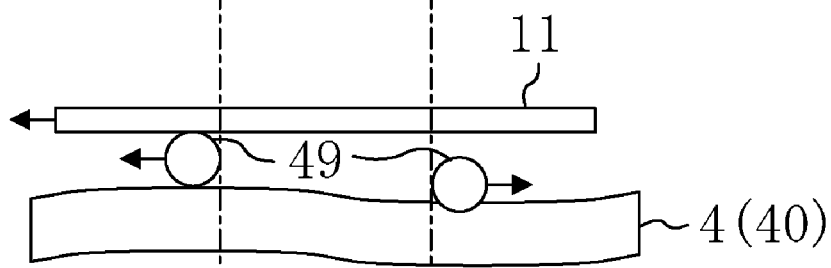

Specifically, when the piezoelectric element unit 40 stretches in the lengthwise direction (the direction of the longitudinal vibration), one of the driver elements 49 (e.g., left one in FIG. 13) moves in the lengthwise direction to pass closer to the stage 11 than to the piezoelectric element unit 40 in the widthwise direction (the direction of the bending vibration) as shown in FIG. 13B and applies increased friction against the stage 11. With this friction, the stage 11 is displaced toward the moving direction of the one of the driver elements 49 in the lengthwise direction (to the left in FIG. 13). At the same time, the other driver element 49 (right one in FIG. 13) moves in the lengthwise direction opposite from the moving direction of the former driver element 49 to pass closer to the piezoelectric element unit 40 than to the stage 11 in the widthwise direction (to be spaced from the stage 11). Therefore, the friction between the driver element 49 and the stage 11 is reduced or zero. Thus, the latter driver element 49 has little influence on the displacement of the stage 11.

Figure 13C:
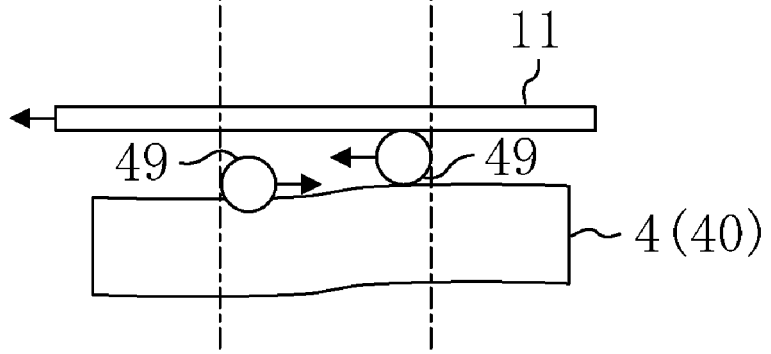

In the case where the piezoelectric element unit 40 contracts in the lengthwise direction, the latter driver element 49 (right one in FIG. 13) moves in the lengthwise direction to pass closer to the stage 11 than to the piezoelectric element unit 40 in the widthwise direction as shown in FIG. 13C and applies increased friction against the stage 11. With this friction, the stage 11 is displaced toward the moving direction of the latter driver element 49 in the lengthwise direction (to the left in FIG. 13). At the same time, the former driver element 49 (left one in FIG. 13) moves in the lengthwise direction opposite from the moving direction of the latter driver element 49 to pass closer to the piezoelectric element unit 40 than to the stage 11 in the widthwise direction. Therefore, the friction between the former driver element 49 and the stage 11 is reduced or zero. Thus, the former driver element 49 has little influence on the displacement of the stage 11. The direction of the displacement in this case is the same as the moving direction of the stage 11 driven by the former driver element 49 when the piezoelectric element unit 40 is stretched.

In this manner, the two driver elements 49 alternately allow the stage 11 to move in the same direction (to the left in FIG. 13) while their phases are shifted from each other by 180°. If the AC voltages with their phases shifted from each other by −90° are applied to the external electrodes 46 and 47, the driver elements 49 deliver the driving force in the opposite direction such that the stage 11 moves in the opposite direction (to the right in FIG. 13).

The travel distance of the stage 11 is adjusted by controlling at least one of the voltage value, the frequency and the feeding period of the AC voltages applied to the external electrodes 46 and 47. Alternately, the adjustment is carried out by changing the value of phase difference between the AC voltages applied to the external electrodes 46 and 47, for example, other than 90°.

As the ultrasonic actuator 2 is arranged to be biased toward the stage 11 as described above, the biasing force keeps the stage 11 still when the stage 11 is not driven. That is, the ultrasonic actuator 2 for driving the stage 11 has a function of keeping the stage 11 substantially still and there is no need of providing an additional mechanism for keeping the stage 11 substantially still (hereinafter, this function is referred to as a self-keeping function).

The ultrasonic actuator 2 is able to produce high torque at a relatively low speed and keep the stage still by static friction in a non-operating state.

In the heating mode, the piezoelectric element unit 40 vibrates at a resonance frequency of the longitudinal vibration in the thickness direction (stacking direction). If the shape of the piezoelectric element unit 40 is designed such that the resonance frequency of the longitudinal vibration in the thickness direction varies from that of the longitudinal vibration in the lengthwise direction and the bending vibration and an AC voltage having the resonance frequency of the longitudinal vibration in the thickness direction is applied to the piezoelectric element unit 40, the piezoelectric element unit 40 is resonated in the thickness direction. As a result, the longitudinal vibration in the lengthwise direction and the bending vibration are reduced as small as negligible.

To be more specific, in the heating mode, the microcomputer 71 sets the frequency of the AC voltage to the resonance frequency of the first mode of longitudinal vibration in the thickness direction of the piezoelectric element unit 40, sets the phases of the two AC voltages equal and selects a predetermined voltage value of the AC voltage. That is, the control unit 7 outputs the two AC voltages having the same phases at the resonance frequency of the longitudinal vibration in the thickness direction to the ultrasonic actuator 2.

Then, the piezoelectric element unit 40 repeats expansion and contraction in the thickness direction. As the center of the driver elements 49 in the thickness direction is aligned with the center of the piezoelectric element unit 40 in the thickness direction, the driver elements 49 are not displaced in the thickness direction, but just expand and contract in the thickness direction. The expansion and contraction of the driver elements 49 in the thickness direction are symmetrical with respect to the center of the driver elements 49 in the thickness direction. That is, the driver elements 49 do not deliver the driving force in the moving direction of the stage 11 (i.e., the lengthwise direction of the piezoelectric element unit 40) and in the thickness direction of the piezoelectric element unit 40.

As the piezoelectric element unit 40 vibrates at the resonance frequency, the amplitude of the vibration increases as described above. At the same time, the impedance of the piezoelectric element unit 40 is extremely reduced to allow excessive current to flow and the piezoelectric element unit 40 is heated. The heating mode makes use of the excessive heat of the piezoelectric element unit 40 to remove the condensation on the ultrasonic actuator 2. Specifically, the piezoelectric element unit 40 vibrates at the resonance frequency to raise the temperature of the piezoelectric element unit 40, or the ultrasonic actuator 2, such that the condensation on the ultrasonic actuator 2 is removed.

In the heating mode, the ultrasonic actuator 2 is resonated in a vibration mode in which the driving force is not output to the stage 11 (i.e., the first mode of longitudinal vibration in the thickness direction of the piezoelectric element unit 40).

At the same time, the piezoelectric element unit 40 generates heat and the condensation on the ultrasonic actuator 2 is removed by the heat.

The piezoelectric element unit 40 is heated only when the temperature of the piezoelectric element unit 40 is not higher than a first predetermined temperature. To be more specific, the control unit 7 receives the detection signal of the temperature sensor 81 and calculates the temperature of the piezoelectric element unit 40 based on the detection signal. If the calculated temperature reaches the first predetermined temperature, the current flow to the piezoelectric element unit 40 is stopped to terminate the heating of the piezoelectric element unit 40. After that, when the temperature of the piezoelectric element unit 40 decreases to a second predetermined temperature lower than the first predetermined temperature, the current is allowed to flow to the piezoelectric element unit 40 again. In this manner, the piezoelectric element unit 40 is heated in the temperature range not lower than the second predetermined temperature and not higher than the first predetermined temperature. When the temperature of the piezoelectric element unit 40 reaches the first predetermined temperature, the heating may be restrained by changing the voltage value, current value or frequency of the AC voltage instead of stopping the current flow to the piezoelectric element unit 40. The first predetermined temperature is preferably set to a temperature at which the polarization characteristic of the piezoelectric layers 41 of the piezoelectric element unit 40 does not deteriorate.

The heating mode is continued based on the detection signal of the condensation sensor 82 until the condensation on the ultrasonic actuator 2 is removed. When a judgment that the condensation has been removed is made based on the detection signal of the condensation sensor 82, the control unit 7 switches the ultrasonic actuator 2 from the heating mode to the normal operation mode.

According to Embodiment 1, the control unit 7 drives the ultrasonic actuator 2 in the normal operation mode when the condensation is not generated on the ultrasonic actuator 2 such that the stage 11 is moved. If the condensation occurs on the ultrasonic actuator 2, the ultrasonic actuator 2 is heated in the heating mode to remove the condensation. Thus, even in an environment where the condensation is likely to occur, the condensation on the ultrasonic actuator 2 is eliminated and the malfunction of the ultrasonic actuator 2 is prevented.

Since the condensation is removed by heat generated by the piezoelectric element unit 40 itself, it is not necessary to provide the drive unit 1 with an additional mechanism for removing the condensation. This makes it possible to prevent an increase in size, complexity and cost of the drive unit 1.

In the heating mode, the control unit 7 monitors the temperature of the piezoelectric element unit 40 to control the temperature of the piezoelectric element unit 40 within the predetermined range. Thus, breakage of the piezoelectric element unit 40 is less likely to occur.

According to Embodiment 1, since the piezoelectric element unit 40 is heated in the heating mode at the resonance frequency of the first mode of longitudinal vibration in the thickness direction, the piezoelectric element unit 40 does not vibrate in the lengthwise direction of the piezoelectric element unit 40 which is the moving direction of the stage 11, but vibrates in the thickness direction thereof. Therefore, the state of the stage 11 is hardly affected, i.e., the piezoelectric element unit 40 is heated while the position of the stage 11 is kept unchanged. If the piezoelectric element unit 40 vibrates in the first mode of longitudinal vibration in the thickness direction and the center of the driver elements 49 in the thickness direction is aligned with the center of the piezoelectric element unit 40 in the thickness direction, the driver elements 49 are not displaced in the thickness direction but only expand or contract with respect to the center of the piezoelectric element unit 40. Therefore, the friction between the driver elements 49 and the stage 11 caused by the expansion and contraction is canceled in the thickness direction and the force caused by the friction is not applied to the stage 11.

If the driver elements 49 are configured as spherical elements to bring them into point contact with the stage 11 and the driver elements 49 are arranged at the center of the piezoelectric element unit 40 in the thickness direction, the point of contact between each of the driver elements 49 and the stage 11 is not displaced even if the piezoelectric element unit 40 vibrates in the first mode of longitudinal vibration in the thickness direction. Therefore, the driver elements 49 do not generate force by friction in the thickness direction. Thus, the piezoelectric element unit 40 is heated without any force applied to the stage 11 (i.e., without any net force).

As described later in Embodiment 2, the driver elements 49 may be configured to vibrate in such a mode of vibration that they do not apply the driving force to the stage 11 in the heating mode. If two or more driver elements 49 are in contact with the stage 11 as described in Embodiment 1, the driving force may slightly be applied to the stage 11 depending on the difference between the driver elements 49 in state of contact with the stage 11 and the misalignment of the driver elements 49 with respect to the actuator body 4. However, according to the present embodiment, the vibration direction of the piezoelectric element unit 40 in the heating mode is the thickness direction of the piezoelectric element unit 40 orthogonal to the moving direction of the stage 11. Therefore, the difference between the driver elements 49 in state of contact with the stage 11 and the misalignment of the driver elements 49 with respect to the piezoelectric element unit 40 are negligible.

Embodiment 2

A drive unit according to Embodiment 2 of the invention will be described.

The drive unit of Embodiment 2 is configured the same as the drive unit 1 of Embodiment 1, but it is controlled in a different manner in the heating mode.

Figure 6:
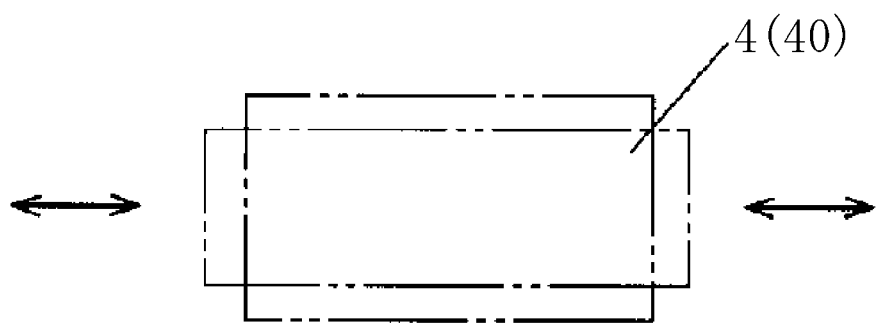
FIG. 6 is a conceptual diagram illustrating the displacement of the actuator body in the first mode of longitudinal vibration.
Figure 7:
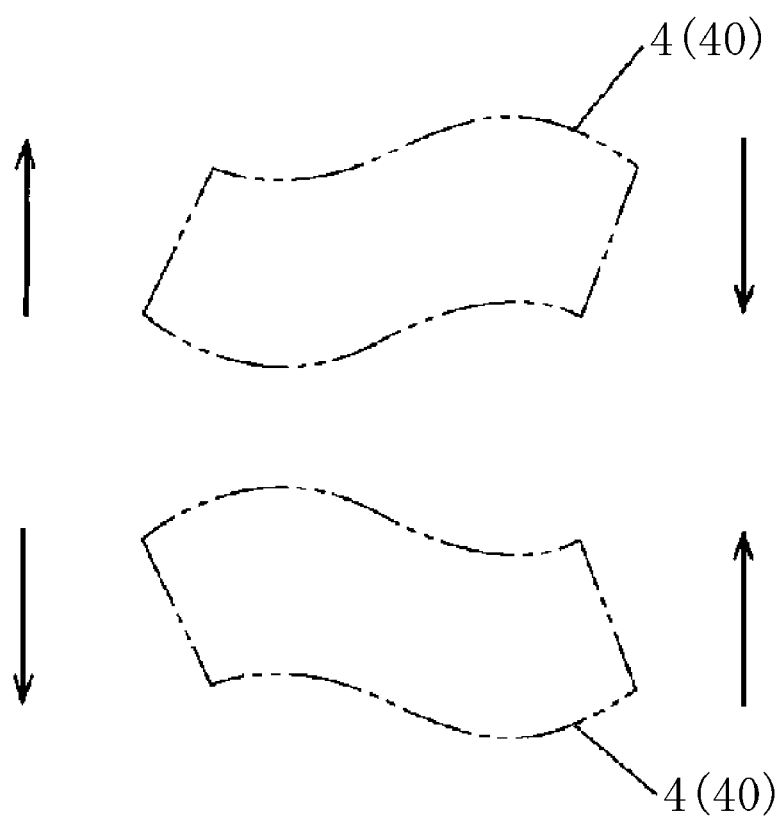
FIG. 7 is a conceptual diagram illustrating the displacement of the actuator body in the second mode of bending vibration.
Figure 8A:
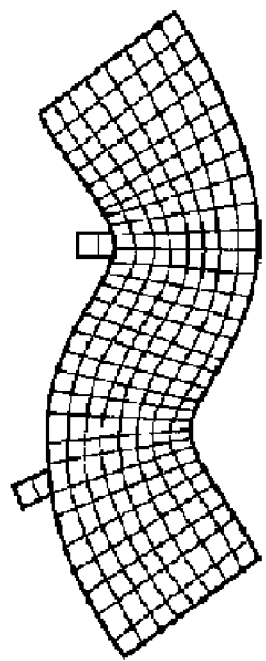
FIGS. 8A to 8D are conceptual diagrams illustrating the movement of the actuator body.
Figure 8B:
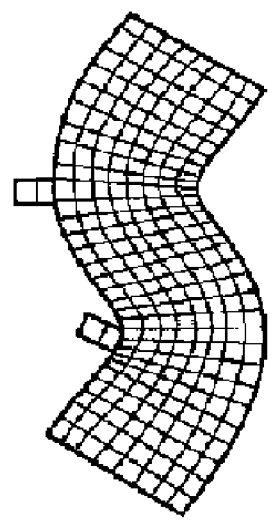
Figure 8C:
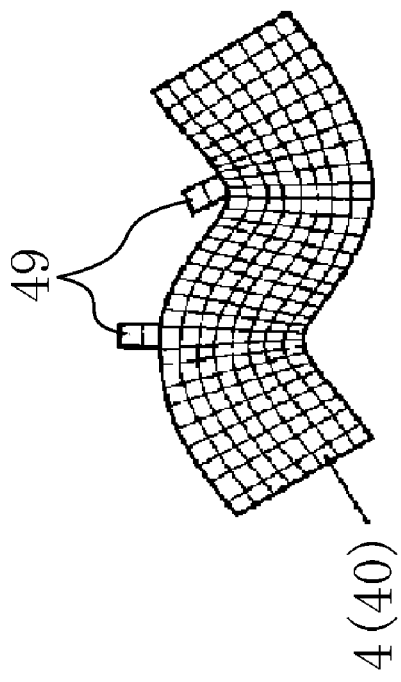
Figure 8D:
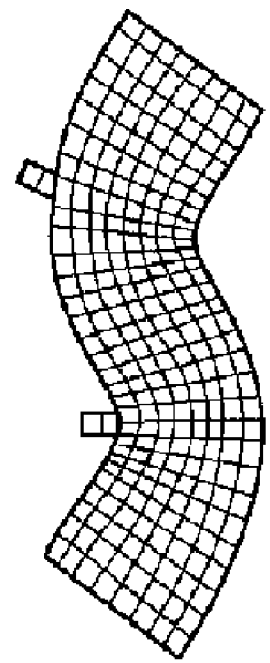

To be more specific, in the heating mode, the control unit 7 sets the frequency of the AC voltage applied to the piezoelectric element unit 40 not to the resonance frequency of the longitudinal vibration in the thickness direction of the piezoelectric element unit 40, but to the resonance frequency of the first mode of longitudinal vibration in the lengthwise direction of the piezoelectric element unit 40 (in the present embodiment, this is the same as the resonance frequency of the second mode of bending vibration). Further, the phases of the AC voltages applied to the external electrodes 46 and 47 are not shifted from each other by 90° but set equal. As a result, the four areas corresponding to the four electrodes of the piezoelectric element unit 40 expand and contract at the same time and the piezoelectric element unit 40 is substantially induced to make only longitudinal vibration in the lengthwise direction as shown in FIG. 6.

The driver elements 49 are arranged in symmetry with respect to a straight line orthogonal to the stage 11 and passing the center of the piezoelectric element unit 40 in the lengthwise direction, which is the node of the longitudinal vibration in the lengthwise direction. Therefore, the driver elements 49 vibrate symmetrically in the lengthwise direction with respect to the center of the piezoelectric element unit 40 in the lengthwise direction when the piezoelectric element unit 40 vibrates in the first mode of longitudinal vibration in the lengthwise direction. As a result, the frictions applied to the stage 11 by the vibrating driver elements 49 cancel each other, i.e., the driver elements 49 do not deliver the driving force (i.e., net driving force) to the stage 11. In this manner, the ultrasonic actuator 2 is heated while the self-keeping function is exerted. The temperature control of the piezoelectric element unit 40 and the other characteristics of the drive unit of Embodiment 2 are the same as those of Embodiment 1.

The normal operation mode is also the same as described in Embodiment 1.

According to Embodiment 2, the control unit 7 operates the ultrasonic actuator 2 in the normal operation mode to move the stage 11 when the condensation does not occur on the ultrasonic actuator 2. If the condensation occurs on the ultrasonic actuator 2, the ultrasonic actuator 2 is operated in the heating mode such that the ultrasonic actuator 2 is heated to remove the condensation. Thus, even in the environment where the condensation is likely to occur, the condensation on the ultrasonic actuator 2 is eliminated and the malfunction of the ultrasonic actuator 2 is prevented.

Further, since the AC voltages having the same voltage value and the same phase are applied to the first feeding electrode layer 42 and the second feeding electrode layer 43 in the heating mode, the driver elements 49 vibrate in symmetry with respect to a straight line passing the middle of a linear segment connecting the driver elements 49 and orthogonal to the moving direction of the stage 11. Therefore, the driving forces applied by the driver elements 49 to the stage 11 cancel each other and the ultrasonic actuator 2 is heated with hardly any influence on the state of the stage 11, i.e., the state of the stage 11 is kept unchanged.

Thus, Embodiment 2 offers the same effect as that of Embodiment 1.

Embodiment 3

A drive unit according to Embodiment 3 of the invention will be described.

The drive unit of Embodiment 3 is configured the same as the drive unit 1 of Embodiment 1, but it is controlled in a different manner especially in the switching between the normal operation mode and the heating mode.

To be more specific, the drive unit 1 of Embodiment 3 always enters the heating mode when it is started. During the operation of the ultrasonic actuator 2 (some period after the start), the temperature of the ultrasonic actuator 2 is relatively high due to the heat generation by the piezoelectric element unit 40. Therefore, the condensation is less likely to occur. On the other hand, the temperature of the ultrasonic actuator 2 before the start may be lower than the ambient temperature to such an extent that the condensation occurs. Therefore, regardless of the presence or absence of the condensation, the ultrasonic actuator 2 is heated in the heating mode when the drive unit 1 is actuated. In this manner, the malfunction of the ultrasonic actuator 2 caused by the condensation already exists before the start is surely prevented.

If the drive unit 1 is provided with a timer and the ultrasonic actuator 2 is actuated within a certain period of time after the last operation is finished, the drive unit 1 may start not in the heating mode but in the normal operation mode. Specifically, if the ultrasonic actuator 2 is actuated within the certain period of time after the last operation is finished, the temperature of the ultrasonic actuator 2 is still high and the possibility of the occurrence of the condensation is low.

According to Embodiment 3 in which the drive unit is controlled to start in the heating mode, the condensation sensor 82 is not necessary. As a matter of course, it is possible to provide the condensation sensor 82. Specifically, if the condensation sensor 82 is provided, the condensation generated during the operation of the ultrasonic actuator 2 is detected by the condensation sensor 82 and the drive unit 1 is switched to the heating mode. In this manner, the malfunction of the ultrasonic actuator 2 caused by the condensation is surely prevented not only at the start of the drive unit 1 but also during the operation thereof.

Other Embodiments

The drive units of Embodiments 1 to 3 may be configured as follows.

According to the above-described embodiments, the ultrasonic actuator 2 is configured such that the actuator body 4 vibrates in the first mode of longitudinal vibration in the lengthwise direction and the second mode of bending vibration in harmony. However, the present invention is not limited thereto. The ultrasonic actuator 2 may generate other kinds of vibrations and other modes. The ultrasonic actuator 2 may be configured in any way as long as it functions as a vibration actuator in which the actuator body 4 vibrates to deliver the driving force caused by the friction between the driver elements 49 and the stage 11.

Figure 14:
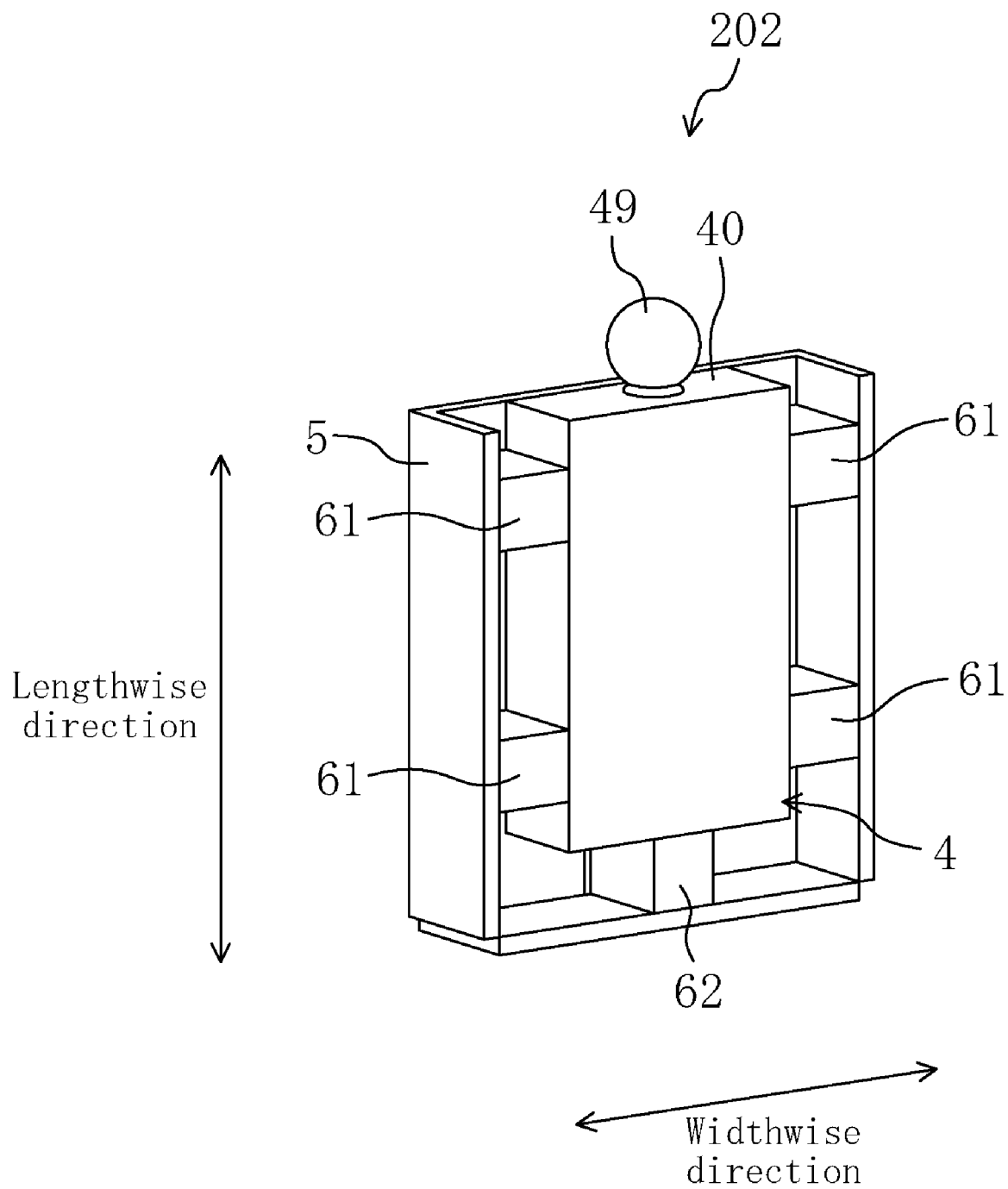
FIG. 14 is a perspective view of another embodiment of an ultrasonic actuator.

The configuration of the ultrasonic actuator 2 is not limited to that described above. For example, instead of feeding the piezoelectric element unit 40 via the support rubbers 61 and the bias rubber 62, leads may be connected to the piezoelectric element unit 40 to feed the piezoelectric element unit 40. The node of the vibration of the piezoelectric element unit 40 may be supported by an inelastic member. It is also possible to adopt an ultrasonic actuator 202 as shown in FIG. 14 in which a single driver element 49 is provided on one of the short side surfaces of the piezoelectric element unit 40. With this configuration, the driver element 49 makes a circular motion as the piezoelectric element unit 40 generates the composite vibration of the first mode of longitudinal vibration in the lengthwise direction and the second mode of bending vibration such that the stage 11 moves in the predetermined moving direction (parallel to the widthwise direction) via the friction between the driver element 49 and the stage 11. Further, in place of the piezoelectric element unit 40 which functions as the actuator body 4, a structure prepared by adhering a piezoelectric element on a metal substrate or a resonator made of metal with a piezoelectric element sandwiched between may be used. In such a case, the resonator including the piezoelectric element functions as the actuator body.

The drive units of the above-described embodiments are configured to exert the self-keeping function in the heating mode. However, the present invention is not limited thereto. For example, an AC voltage having a frequency slightly different from the common resonance frequency of the first mode of longitudinal vibration in the lengthwise direction of the piezoelectric element unit 40 and the second mode of bending vibration is applied to the piezoelectric element unit 40 in the normal operation mode, while an AC voltage having a frequency closer to the common resonance frequency than to the former AC voltage is applied to the piezoelectric element unit 40 in the heating mode. In the heating mode, the phases of two driving voltages may be shifted from each other substantially by 180° such that the piezoelectric element unit 40 generates only the longitudinal vibration. To be more specific, the present invention is not limited to the modes of vibration mentioned in the embodiments. The drive unit of the invention may optionally be configured as long as the piezoelectric element is heated with substantially no influence on the movement of the stage 11 in the driving direction.

Even if the self-keeping function is not exerted, the driver elements 49 make the circular motion to drive the stage 11 in the normal operation mode while the heat generation of the piezoelectric element unit 40 kept small. Further, the piezoelectric element unit 40 is heated and the condensation is removed in the heating mode while the driver elements 49 make the circular motion. That is, at first in the heating mode, the stage 11 is not driven or moves at a speed lower than the normal speed. Then, after the stage 11 moves unstably for a while, the condensation is removed and the stage 11 starts to move at the normal speed in a correct manner. Although the stage 11 moves unstably in the heating mode, the condensation is removed by heat generated by the piezoelectric element unit 40 itself.

For heating the piezoelectric element unit 40 with the self-keeping function exerted, the piezoelectric element unit 40 of Embodiment 1 is resonated to make the longitudinal vibration in the thickness direction, while the piezoelectric element unit 40 of Embodiment 2 is resonated to make the longitudinal vibration in the lengthwise direction. However, the present invention is not limited thereto. Specifically, the vibration of the piezoelectric element unit 40 occurs in a three-dimensional manner. Therefore, when the stage 11 is adapted to move one-dimensionally, i.e., when the ultrasonic actuator 2 outputs the driving force in one certain direction in a one-dimensional manner, the piezoelectric element unit 40 is allowed to vibrate in the other two directions. Further, when the stage 11 is adapted to move two-dimensionally, i.e., when the ultrasonic actuator 2 outputs the driving forces in two directions in two-dimensional manner or two ultrasonic actuators 2 which output the driving force in a single direction in one-dimensional manner, respectively, are used in combination, the piezoelectric element unit 40 is allowed to vibrate in the remaining one direction. In this manner, the piezoelectric element unit 40 is heated to remove the condensation with the self-keeping function is exerted.

Figure 15:
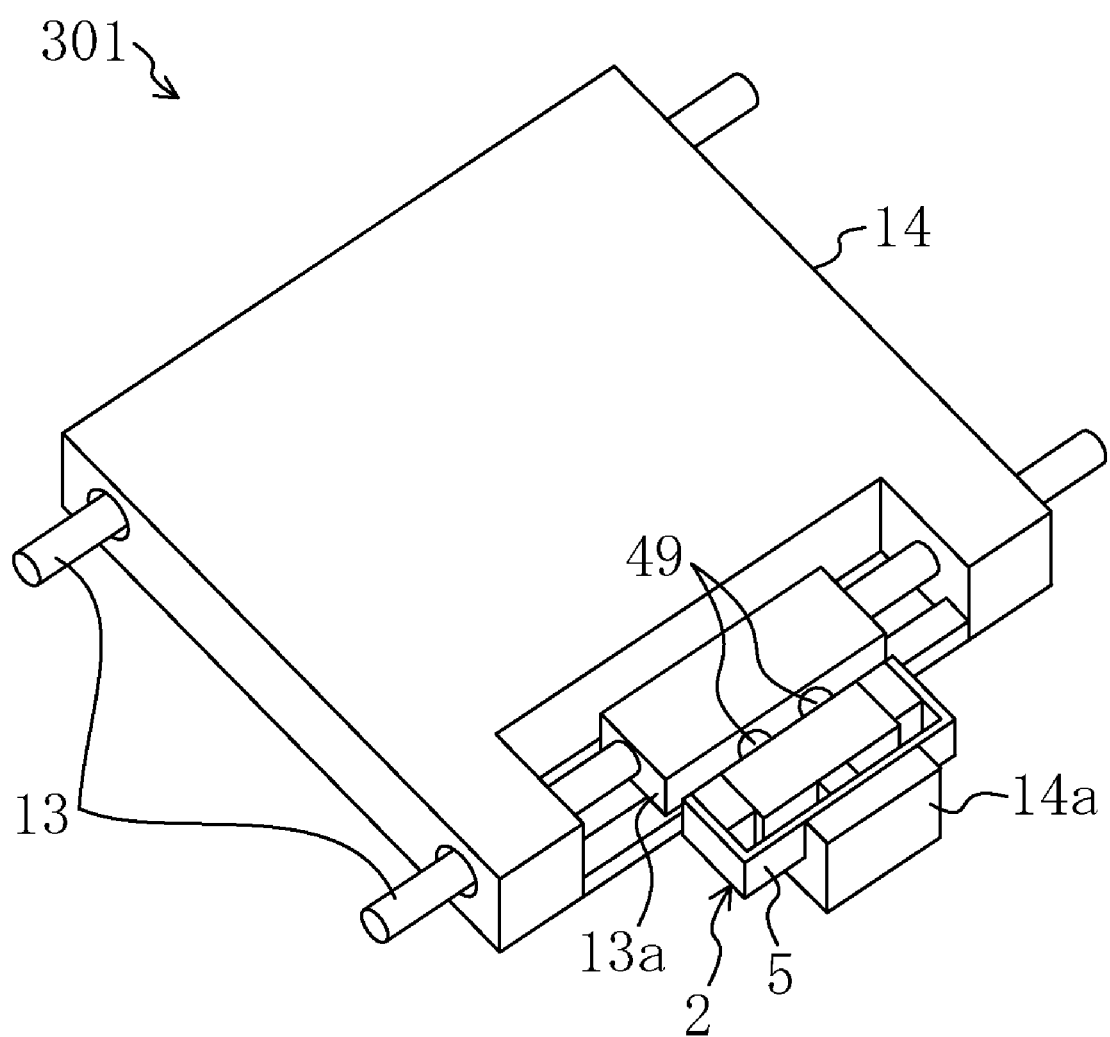
FIG. 15 is a perspective view of another embodiment of a drive unit.

In the above-described embodiments, the ultrasonic actuator 2 is fixed to the base and the driver elements 49 are brought into contact with the movable stage 11 and the ultrasonic actuator 2 is operated to drive the stage 11. However, as shown in FIG. 15, the ultrasonic actuator 2 may be fixed to the stage. Specifically, a drive unit 301 includes rails 13 fixed in parallel with each other on a base, a stage 14 slidably attached to the rails 13 and an ultrasonic actuator 2. One of the rails 13 is provided with an abutment 13a fixed to the rail 13. The stage 14 is provided with an actuator mount 14a. A case 5 is mounted on the actuator mount 14a of the stage 14 such that driver elements 49 of the ultrasonic actuator 2 are in contact with the abutment 13a of the rail 13. When the ultrasonic actuator 2 is actuated in this state, the driver elements 49 deliver the driving force to the abutment 13a. Then, the ultrasonic actuator 2 vibrates relatively to the abutment 13a in the lengthwise direction of the rails 13 because the abutment 13a is fixed. As a result, the stage 14 joined with the case 5 via the actuator mount 14a is driven in the lengthwise direction of the rails 13.

In the embodiments described above, whether or not the condensation has occurred on the ultrasonic actuator 2 is detected by the condensation sensor 82. However, the invention is not limited thereto. For example, the condensation sensor may be replaced with a humidity sensor and the judgment as to the presence of the condensation is determined based on the detection results of the humidity sensor and the temperature sensor 81. In this case, the humidity sensor and the temperature sensor function as a condensation detector.

As described above, with respect to a drive unit including a vibration actuator using a piezoelectric element, the present invention is useful for improvement in performance of the interface at which friction drive occurs.

It should be noted that the present invention is not limited to the above embodiment and various modifications are possible within the spirit and essential features of the present invention. The above embodiment shall be interpreted as illustrative and not in a limiting sense. The scope of the present invention is specified only by the following claims and the description of the specification is not limitative at all. Further, it is also to be understood that all the changes and modifications made within the scope of the claims fall within the scope of the present invention.

What is claimed is:

1. A drive unit including a vibration actuator using a piezoelectric element comprising:
   a control section for controlling the vibration actuator switchably between a normal operation mode in which the piezoelectric element vibrates at a predetermined frequency to let the vibration actuator output a driving force, and a heating mode in which the piezoelectric element vibrates at a frequency different from the frequency in the normal operation mode to heat the piezoelectric element; and
   a condensation detector for detecting whether or not condensation has occurred on the vibration actuator,
   wherein the control section enters the heating mode when the condensation is detected by the condensation detector.

2. The drive unit of claim 1, wherein the control section enters the heating mode when it is started.

3. A drive unit including a vibration actuator using a piezoelectric element comprising:
   a control section for controlling the vibration actuator switchably between a normal operation mode in which the piezoelectric element vibrates at a predetermined frequency to let the vibration actuator output a driving force, and a heating mode in which the piezoelectric element vibrates at a frequency different from the frequency in the normal operation mode to heat the piezoelectric element;
   a temperature detector for detecting a value related to the temperature of the piezoelectric element, wherein the control section allows heating of the piezoelectric element in a temperature range not higher than a predetermined temperature based on the detection result of the temperature detector in the heating mode; and
   a condensation detector for detecting whether or not condensation has occurred on the vibration actuator,
   wherein the control section enters the heating mode when the condensation is detected by the condensation detector.

4. A drive unit including a vibration actuator using a piezoelectric element comprising:
   a control section for controlling the vibration actuator switchably between a normal operation mode in which the piezoelectric element vibrates at a predetermined frequency to let the vibration actuator output a driving force, and a heating mode in which the piezoelectric element vibrates at a frequency different from the frequency in the normal operation mode to heat the piezoelectric element,
   wherein the control section in the normal operation mode allows the vibration actuator to vibrate in a predetermined vibration mode such that the vibration actuator outputs the driving force, and the control section in the heating mode allows the vibration actuator to vibrate in a vibration mode different from that in the normal operation mode such that the piezoelectric element is heated while the vibration actuator does not output the driving force, and further comprising a condensation detector for detecting whether or not condensation has occurred on the vibration actuator, wherein the control section enters the heating mode when the condensation is detected by the condensation detector.

5. A drive unit including a vibration actuator using a piezoelectric element comprising:

a control section for controlling the vibration actuator switchably between a normal operation mode in which the piezoelectric element vibrates at a predetermined frequency to let the vibration actuator output a driving force, and a heating mode in which the piezoelectric element vibrates at a frequency different from the frequency in the normal operation mode to heat the piezoelectric element;

wherein the control section in the normal operation mode allows the vibration actuator to vibrate in a predetermined vibration mode such that the vibration actuator outputs the driving force, the control section in the heating mode allows the vibration actuator to vibrate in a vibration mode different from that in the normal operation mode such that the piezoelectric element is heated while the vibration actuator does not output the driving force, the vibration actuator is shaped to have a lengthwise direction, a widthwise direction and a thickness direction orthogonal to the lengthwise and widthwise directions, the control section allows the vibration actuator to make longitudinal vibration in the lengthwise direction and bending vibration in the widthwise direction to let the vibration actuator output the driving force in the normal operation mode, and the control section allows the vibration actuator to make longitudinal vibration in the thickness direction without outputting the driving force such that the piezoelectric element is heated in the heating mode, and further comprising a condensation detector for detecting whether or not condensation has occurred on the vibration actuator, wherein the control section enters the heating mode when the condensation is detected by the condensation detector.

\* \* \* \* \*